United States Patent
Dietz et al.

(10) Patent No.: US 7,001,804 B2
(45) Date of Patent: Feb. 21, 2006

(54) METHOD OF PRODUCING ACTIVE SEMICONDUCTOR LAYERS OF DIFFERENT THICKNESSES IN AN SOI WAFER

(75) Inventors: Franz Dietz, Untereisesheim (DE); Volker Dudek, Brackenheim (DE); Michael Graf, Leutenbach (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 11/048,963

(22) Filed: Jan. 31, 2005

(65) Prior Publication Data

US 2005/0170571 A1 Aug. 4, 2005

(30) Foreign Application Priority Data

Jan. 30, 2004 (DE) .................. 10 2004 005 506

(51) Int. Cl.
*H01L 21/84* (2006.01)
(52) U.S. Cl. .................. 438/164; 438/413
(58) Field of Classification Search ........... 438/413
See application file for complete search history.

(56) References Cited

U.S. PATENT DOCUMENTS

| 5,258,318 | A | * | 11/1993 | Buti et al. ................ 438/154 |
|---|---|---|---|---|
| 5,457,338 | A | | 10/1995 | Borel |
| 6,204,098 | B1 | | 3/2001 | Anceau |
| 6,331,470 | B1 | * | 12/2001 | Sanfilippo et al. .......... 438/311 |
| 6,664,146 | B1 | | 12/2003 | Yu |
| 2003/0104658 | A1 | * | 6/2003 | Furukawa et al. .......... 438/151 |
| 2003/0104681 | A1 | | 6/2003 | Davari et al. |
| 2004/0173850 | A1 | * | 9/2004 | Yeo .......................... 257/350 |
| 2004/0185606 | A1 | * | 9/2004 | Gonzalez et al. .......... 438/149 |

FOREIGN PATENT DOCUMENTS

| DE | 197 32 237 | 7/1998 |
|---|---|---|
| EP | 1 049 156 | 11/2000 |
| EP | 1 246 248 | 10/2002 |

* cited by examiner

*Primary Examiner*—Trung Dang
(74) *Attorney, Agent, or Firm*—W. F. Fasse; W G. Fasse

(57) ABSTRACT

An SOI wafer including an active semiconductor material layer on an insulating layer is processed to form thereon first and second active semiconductor regions that respectively have different thicknesses and that are vertically and laterally insulated. In the process, a trench is etched into the SOI wafer, seed openings are formed in the bottom of the trench to reach the underlying active material layer, the trench is filled with epitaxially grown semiconductor material progressing from the seed openings, some of the epitaxially grown material is removed to form the second active regions, and oxide layers are provided so that the second active regions are laterally and vertically insulated from the first active regions formed by remaining portions of the active semiconductor material layer.

21 Claims, 4 Drawing Sheets

METHOD OF PRODUCING ACTIVE SEMICONDUCTOR LAYERS OF DIFFERENT THICKNESSES IN AN SOI WAFER

PRIORITY CLAIM

This application is based on and claims the priority under 35 U.S.C. §119 of German Patent Application 10 2004 005 506.8, filed on Jan. 30, 2004, the entire disclosure of which is incorporated herein by reference.

FIELD OF THE INVENTION

The invention relates to a method of producing insulated active semiconductor regions having different layer thicknesses in an SOI wafer including a layer of active semiconductor material on an insulating layer.

BACKGROUND INFORMATION

A conventional method pertinent to the above general field of the invention is known from U.S. Pat. No. 6,204,098, wherein dielectrically insulated islands are produced on an SOI substrate. The insulated islands are filled by epitaxially grown material, whereby the active silicon layer of the SOI wafer serves as a seed for the growth. Through such a process, only insulated islands having the same height or thickness can be produced. An active layer within these islands has a first relatively large thickness. According to FIG. 6 of the cited patent reference, complementary MOS transistors are formed in the islands, and vertical DMOS transistor cells are formed outside of the islands. The vertical DMOS transistor cells are shallower than the dielectrically insulated wells. Furthermore, the vertical DMOS transistor cells are not dielectrically insulated relative to the substrate.

European Patent Application Publication EP 1 049 156 A1 discloses a structure in which a trench is surrounded with an oxide. The trench is filled through an epitaxial lateral overgrowth (ELO) process with the use of a seed, which was formed in the bottom or floor of the trench by opening the oxide layer. Thereafter, the seed opening is closed through a trench. This a rather complicated and space-consuming structure.

In the context of a conventionally known bipolar-CMOS-DMOS (BCDMOS) technology, it is known to provide integrated circuits and their associated fabrication methods, whereby high voltage DMOS capabilities are combined with low voltage CMOS and bipolar characteristics on a single chip. A voltage value of 5 V is a typical example of a low voltage in this context, while a high voltage in this context refers to voltage values up to more than 100 V. DMOS transistors find application as high voltage components, whereby the high voltage can be applied between the drain region and the source region of the transistor.

For future concepts and designs within the field of the BCDMOS technology, it is absolutely necessary to better take into account the special requirements of both the CMOS region (e.g. low leakage currents) as well as the DMOS region (e.g. high power, high dielectric strength, high thermal dissipation, etc.). In order to avoid power losses in the CMOS part due to leakage currents, and to prevent parasitic capacitances, and thereby among other things to improve the performance characteristics of the transistors, it is necessary to provide layer thicknesses in the range of approximately 200 nm when using silicon as the semiconductor material. This, however, is contrary to the requirements and demands for so-called smart-power-elements based on DMOS technology with high dielectric strength and good thermal dissipation. Both of these requirements lead to layer thicknesses that are significantly greater than 1 $\mu$m.

Contrary to the bipolar technology, in the MOS technologies it is possible to systematically reduce the size of the structures, simply by scaling down the size scale of the various component dimensions. Namely, important electrical characteristics of MOS transistors are not dependent on individual lengths, but rather are dependent on ratios or quotients of the transistor width relative to the channel length. Due to this dependence, in principle, all lengths and widths within a circuit can simply be made smaller by a common or consistent scaling factor k, without thereby changing the electrical characteristics.

However, the scaled reduction of size of components in BCDMOS circuits with vertical SOI insulation is limited by the above mentioned mutually contrary requirements. In order to minimize leakage currents at high temperatures, the active silicon thickness in the CMOS part should be very thin, so that the source and the drain lie on the buried oxide. On the other hand, the active silicon layer in the DMOS drift region should be thicker in comparison, in order to increase the voltage withstand characteristic or dielectric strength.

SUMMARY OF THE INVENTION

In view of the above, it is an object of the invention to provide a method for producing semiconductor layers having different thicknesses in an SOI wafer, whereby the variously or differently thick semiconductor layers are dielectrically insulated from other layers lying below such semiconductor layers in the vertical direction, and are dielectrically insulated from each other in the lateral direction. The method shall be simple and economical, and the resulting structures shall be simple and space-saving. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in a method of producing active semiconductor regions on an SOI wafer, comprising the steps:

a) providing an SOI wafer including an active layer of active semiconductor material on an insulating layer;

b) covering at least a selected area of the active layer with a protective layer;

c) in the selected area, forming a trench to penetrate through the protective layer and into the active layer, while leaving first active semiconductor regions of the active semiconductor material of the active layer remaining beside the trench;

d) covering at least a partial surface area of the trench with a first oxide layer;

e) after the step d), forming spacers within the trench directly or indirectly on the first oxide layer at sides of the trench;

f) filling the trench between the spacers with a second oxide layer;

g) forming seed openings through portions of the first oxide layer lying under the spacers by removing the spacers and removing the portions of the first oxide layer to form the seed openings extending to the active semiconductor material of the active layer;

h) epitaxially growing epitaxial semiconductor material regions within the trench beginning and progressing from the seed openings to areas displaced from the seed openings;

i) again opening the seed openings by removing portions of the epitaxial semiconductor material regions in and leading to the seed openings;

j) leaving portions of the epitaxial semiconductor material regions remaining, to form thereof second active semiconductor regions within the trench; and k) after the step i), providing an insulating intermediate material to close and insulate the seed openings;

wherein the first active semiconductor regions have a first thickness in a direction perpendicular to a plane of the insulating layer, the second active semiconductor regions have a second thickness in the stated direction that is smaller than the first thickness, and the second active semiconductor regions are completely laterally and vertically dielectrically insulated from the first active semiconductor regions.

The inventive method enables a simultaneous integration of low power CMOS and high power DMOS (so-called "ultra smart power") on regions or portions of active semiconductor material respectively having different thicknesses. Through the use of an SOI wafer, it is possible to integrate DMOS elements on a thick SOI substrate and CMOS elements on a thin SOI substrate using a common SOI technology on a single common wafer with maximum packing density. The active semiconductor material that is overgrown in the context of the inventive method has no connection to the substrate, so that a complete electrical decoupling or dielectric isolation of the thin active semiconductor layers from the substrate can be achieved. Another advantage of the invention is that the seed openings for the selective epitaxy are formed independent of lithographic processes, whereby space is saved and a higher integration density is achieved. Overall, the inventive method reduces an increase of leakage currents that are expected in connection with a scaled reduction of the structural width.

It is preferred according to the invention that the trench is produced by means of a shallow trench isolation (STI) etching technology, which involves an anisotropic etching process to form an etched trench between active regions that have been covered with a nitride protective layer, and then the trench is filled with an insulating material such as silicon dioxide or polysilicon. Thereby, the STI technology is able to achieve high packing densities.

It is further preferred that the step or process of producing spacers at the sides within the trench structure on the first oxide layer involves the following sub-steps: covering the trench including the inner wall areas of the trench with a polycrystalline semiconductor material, and then anisotropically etching away the polycrystalline semiconductor material from the central floor area of the trench, so that only spacers of the polycrystalline semiconductor material remain along the inner wall regions of the trench.

In view of the above, it is apparent that the material for the spacers is provided by the covering of the trench structure. Further in this regard, an etching process is regarded as anisotropic when the etching front progresses in a certain spatial direction more quickly than in other spatial directions. As a result of a more-rapid etching process in the vertical direction, thereby polycrystalline material will preferentially remain in place along the wall areas of the trench throughout and after the vertical anisotropic etching progresses vertically toward the trench floor. Thus, the remaining polycrystalline material along the trench sidewalls forms the desired poly-spacers. The width of the thusly produced poly-spacers will define the width of the seed openings to be formed in the trench for the following selective epitaxy. In this manner, it is possible to produce seed openings with nearly any desired arbitrarily small dimensions, for example also for technologies with a limited structural resolution. In this context, the term "seed" refers to the exposed surface structure of a monocrystal on which atoms will be deposited and begin to grow in the ELO process, such that the crystal material epitaxially grown in the ELO process will take on or mimic the crystal orientation of the seed crystal, i.e. the exposed surface of the underlying monocrystal.

According to a further preferred feature, the step of filling the trench with a second oxide layer between the spacers involves depositing a tetraethylorthosilicate (TEOS) oxide. In this regard, silicon dioxide is produced through the decomposition of the TEOS compound at moderate temperatures (e.g. up to about 700° C.). This process is also referred to as TEOS pyrolysis, and results in high-value, high-quality oxide films, which are characterized, for example, by a high breakdown or breakthrough field strength and a conforming edge covering ability.

It is also preferred that the step of covering the SOI wafer with a protective layer especially includes the following sub-steps: covering the SOI wafer with a first oxide partial layer; covering the first oxide partial layer with a nitride layer; and covering the nitride layer with a second oxide partial layer. This layering process sequence produces a so-called oxide-nitride-oxide (ONO) layer, which is used as a hard mask in the etching process for forming the trench. In comparison to a "soft" lacquer or resist mask, the use of such a hard mask achieves improved accuracy with which the angles and the shape of the sidewalls of the trench are produced. Moreover, during the later covering of the trench with an oxide layer, the nitride layer of the ONO multilayer prevents an undesired oxidation of areas of the surface of the layer of active semiconductor material lying outside of the trench.

A further preferred embodiment of the invention involves planarization through removal of material so as to reduce the thickness of the protective layer to such an extent that the nitride layer is exposed. In the later chemical-mechanical polishing (CMP) process, the exposed nitride layer can serve as a polishing stop, and thus, in a sense, is repeatedly used for several purposes. Thus, particularly, it is preferred that the planarizing step of the resulting structure is carried out so that the exposed nitride layer is reached as a positive polishing stop. In this manner, the removal of the surface layers is controlled with a very high accuracy.

Another preferred feature is that the first oxide layer that covers the trench is in turn covered with a further layer, i.e. a thin etch stop layer, that will serve as an etch stop in the later etching reduction of the thickness of the second oxide layer (trench filling) to a remaining thickness not greater than or smaller than the depth of the trench. This feature of the invention has the advantage that the desired remaining thickness of the second oxide layer can be achieved with high accuracy.

A further preferred embodiment of the invention is characterized by removing epitaxially deposited or grown semiconductor material in the region of a growth joint, parallel to the step of re-opening the seed openings in the second semiconductor layer. In this context, the growth joint was formed during the epitaxial growth of the epitaxial (second)

semiconductor material. In this manner, undesired leakage currents in the later operation of the device are avoided.

Another preferred feature of the invention is to use silicon as the semiconductor material. It has been found that all of the significant features and embodiments of the invention can be advantageously achieved in a simple manner through the use of silicon as the semiconductor material and through the use of otherwise conventional silicon processing technologies.

The various features of the invention described above and below herein are not limited to the respectively described combinations, but rather can also be provided in other combinations or individually, while still remaining within the scope of the present invention.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF PREFERRED EXAMPLE EMBODIMENTS AND OF THE BEST MODE OF THE INVENTION

Figure 1:
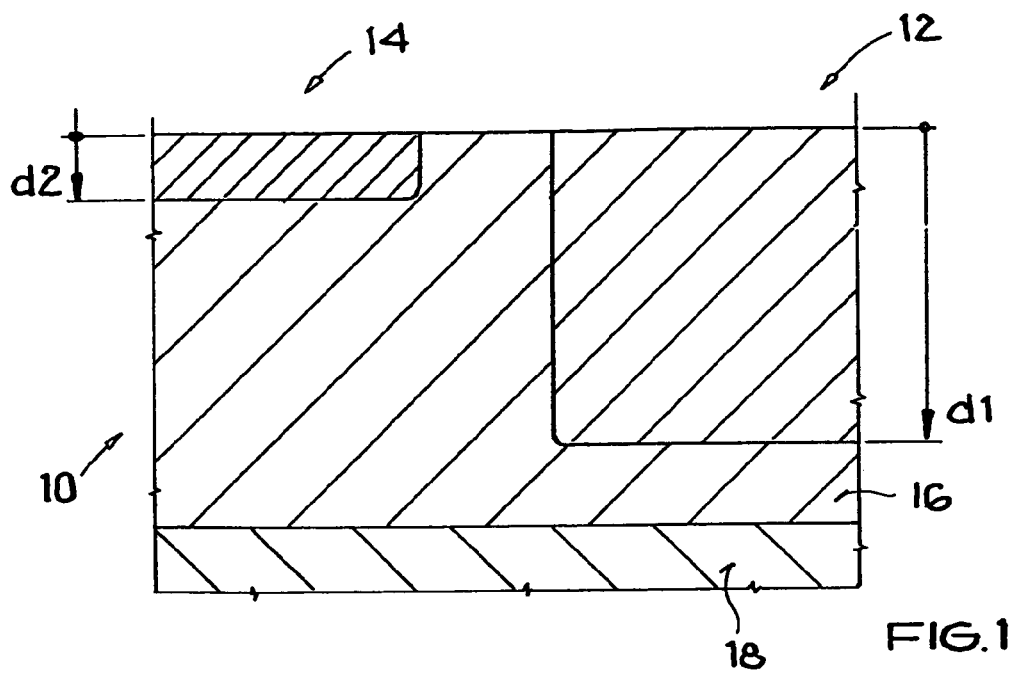
FIG. 1 is a schematic cross-section through a portion of an SOI wafer with two active semiconductor regions having respective different thicknesses.

FIG. 1 shows a cross-section of a portion of an SOI wafer 10, which includes first and second active regions 12 and 14 of active semiconductor material, whereby these two regions respectively have different thicknesses. Namely, the first active region 12 has a comparatively large thickness d1, while the second active region 14 has a comparatively smaller thickness d2. The two active regions 12 and 14 are embedded in an insulating dielectric layer 16, which extends on an underlying handle or handling layer 18.

Due to its comparatively small thickness d2, the second active region 14 is especially well suited to the fabrication of CMOS elements. In order to avoid leakage currents and therewith power losses in the second active region 14, and in order to prevent parasitic capacitances, the thickness d2 should amount to 200 nm for example. On the other hand, the first active region 12 with its comparatively large thickness d1 is especially adapted or well suited to the fabrication of DMOS transistors with a high dielectric strength and good thermal dissipation characteristics. These desired characteristics require a thickness d1 of significantly greater than 1 $\mu$m.

Further in this regard, it can be seen as shown in FIG. 1, that the SOI structure has the two active regions 12 and 14 with different thicknesses d1 and d2 completely dielectrically insulated in both lateral and vertical directions. In other words, the two regions 12 and 14 are completely insulated from each other in the lateral direction, and completely insulated from underlying layers or the substrate in the vertical direction, respectively by the insulating dielectric layer 16. Note that the actually realized structure might vary from the schematic illustration of FIG. 1. For example, the semiconductor material forming the first active region 12 may actually extend under the second active region 14 as well. In that embodiment, the overall or general insulating material 16 may include a flat planar insulating layer under the semiconductor material forming the first active region 12, and an insulating separator structure between the first and second active regions 12 and 14 (see FIGS. 2 to 9).

Figure 2:
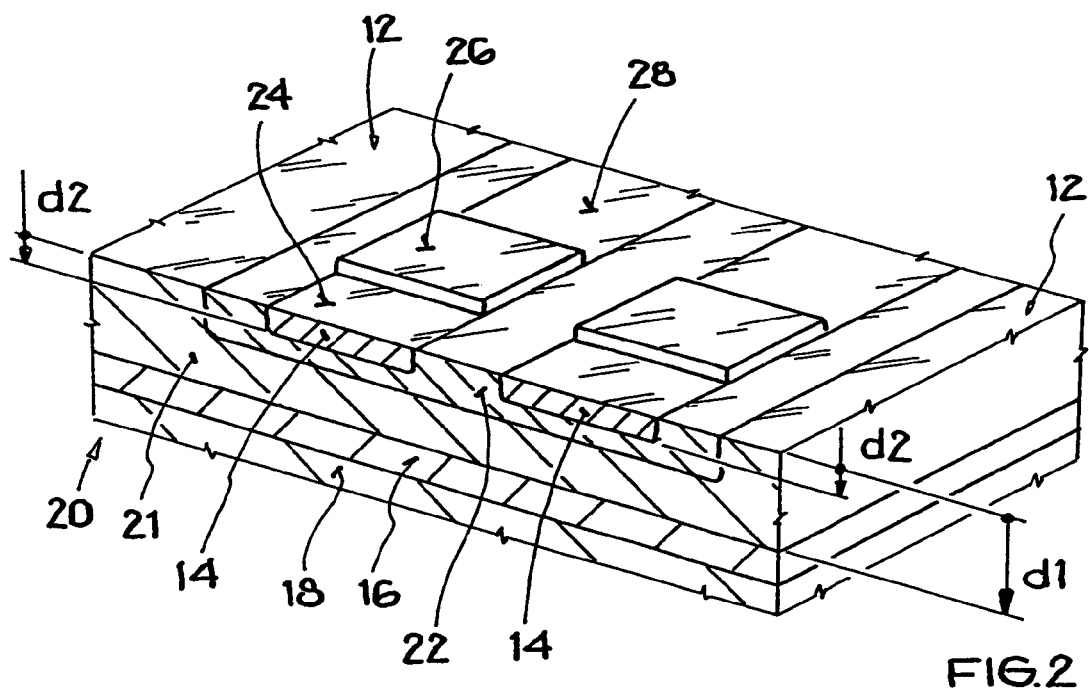
FIG. 2 is a schematic perspective view of a sectioned portion of an SOI wafer with active semiconductor regions having different thicknesses, as produced according to an example embodiment of the inventive method.

With reference to FIGS. 2 to 9, the following discussion will explain a method according to the invention for fabricating or producing the active semiconductor regions 12 and 14 having the different thicknesses d1 and d2 in an SOI wafer. For a better understanding of the fabrication process steps, FIG. 2 shows a typical product resulting from the inventive method. Namely, the resulting product according to the invention involves an SOI wafer 20 including a layer of active semiconductor material 21 extending on the dielectric insulating layer 16. In the particular embodiment of FIG. 2, the insulating layer 16 is an intermediate layer that is arranged on a carrier layer, or handle or handling layer 18.

The overall active semiconductor material includes or comprises the first and second active regions 12 and 14 having the differing thicknesses d1 and d2. Particularly, the illustrated portion of the wafer 20 includes two first regions 12 and two second regions 14. The two second regions 14 are laterally and vertically completely insulated relative to the first regions 12 by an interposed dielectric separator or separating structure 22.

In the relatively shallow second active regions 14 having the thickness d2, field effect transistors will typically be fabricated through subsequent doping steps and contacting steps. For the sake of a generalized illustration, FIG. 2 shows a representative drain region 24, gate region 26, and source region 28, respectively in and/or on each of the second active regions 14. On the other hand DMOS transistors having the required characteristics can be formed through further doping steps and contacting steps in the first active regions 12 of which the layer thickness d1 corresponds to the total thickness of the active semiconductor material layer 21 in the illustrated embodiment.

Figure 3:
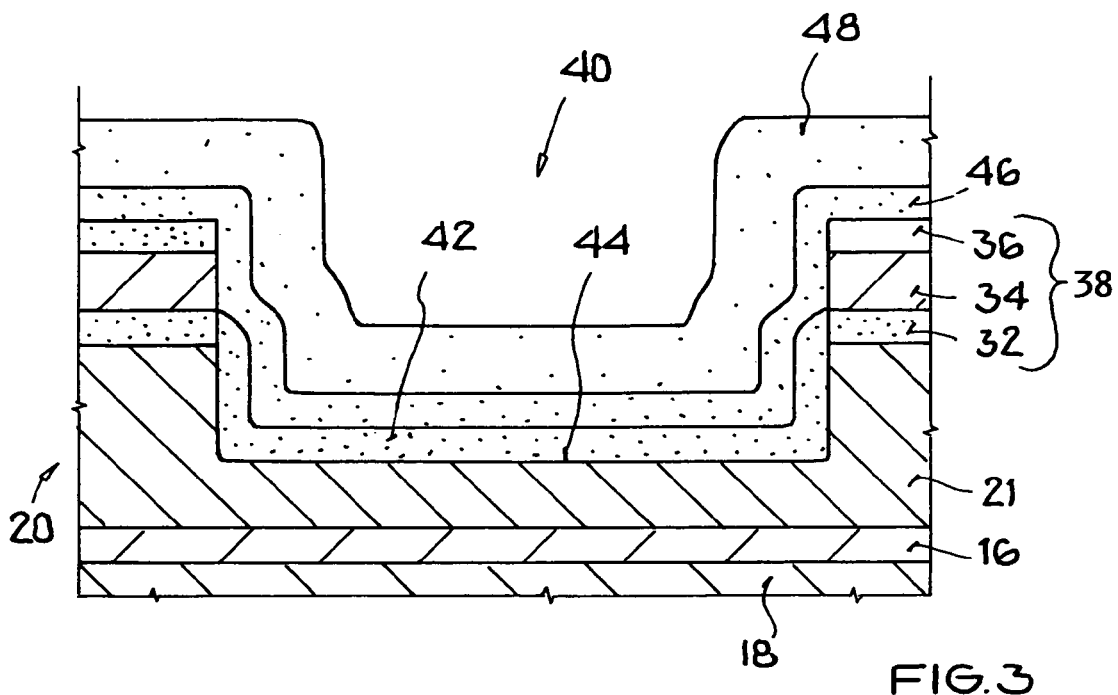
FIG. 3 is a schematic sectional view of a portion of an SOI wafer after initial method steps of the inventive method have been carried out.

FIG. 3 illustrates a few of the initial method steps necessary for producing the structure according to FIG. 2. A planar SOI wafer 20 is used as a starting product. The initially still planar SOI wafer 20 is thermally oxidized, so as to form or grow a first oxide partial layer 32 having a thickness of e.g. 50 nm, on the surface of the wafer 20. Then a nitride layer 34 having a thickness of e.g. 150 nm is deposited on this first oxide partial layer 32 through a chemical vapor deposition (CVD) step. Next, the nitride layer 34 is covered with a second oxide partial layer 36, which is preferably formed as a TEOS oxide and has a thickness of e.g. 50 nm. This layer sequence of the first oxide partial layer 32, the nitride layer 34, and the second oxide partial layer 36 forms a protective layer 38 also known as an ONO multilayer dielectric on the SOI wafer 20.

Next, a trench 40 is formed in the SOI wafer 20. This is preferably achieved through a photolithographic definition of the trench surface area by means of a lithographic masking step on the protective layer 38, followed by an etching process, which may, for example, involve reactive ion etching. In that regard, ions from a plasma are accelerated through an electric field so as to impinge onto and into the wafer 20 through the mask. When the accelerated ions impinge onto the defined trench surface, surface atoms are separated and removed from the lattice of the active semiconductor material layer 21. Furthermore, chemical processes can be superimposed on the resulting physical sputtering effect. By the further continued impingement of ions from the plasma onto the defined trench surface through the mask, the trench 40 is successively formed (i.e. trenched deeper into the wafer 20), for example until the trench reaches a depth of 300 nm.

After completion of the trench etching process, a so-called liner oxidation is carried out, which involves the deposition or application of a relatively thin first oxide layer 42 having a thickness of e.g. 100 nm onto the floor and sidewall surfaces 44 of the trench 40. Optionally, after the liner oxidation to form the first oxide layer 42, a further thin etch stop layer 46 can be deposited, which will serve as an etch stop for a later back-etching of further oxide layers. The thin layer 46 can, for example, consist of a nitride. In this manner, the remaining or residual thickness of the first oxide layer 42, which will later form the bottom or floor layer 72 of the dielectric separator 22 according to FIG. 2, is exactly defined. This is advantageous due to potential substrate couplings and the influence associated therewith on CMOS structures that later will be formed above the separator 22 as shown in FIG. 2.

A final feature still shown in FIG. 3 involves a first step toward the production of spacers for the subsequent process steps. Namely, to begin to form the spacers, the trench 40 including the inner wall areas of the trench 40 is covered with polycrystalline semiconductor material 48, whereby the thickness of this coating may amount to 200 nm, for example. This is the state, resulting from the above described process steps, shown in FIG. 3.

Figure 4:
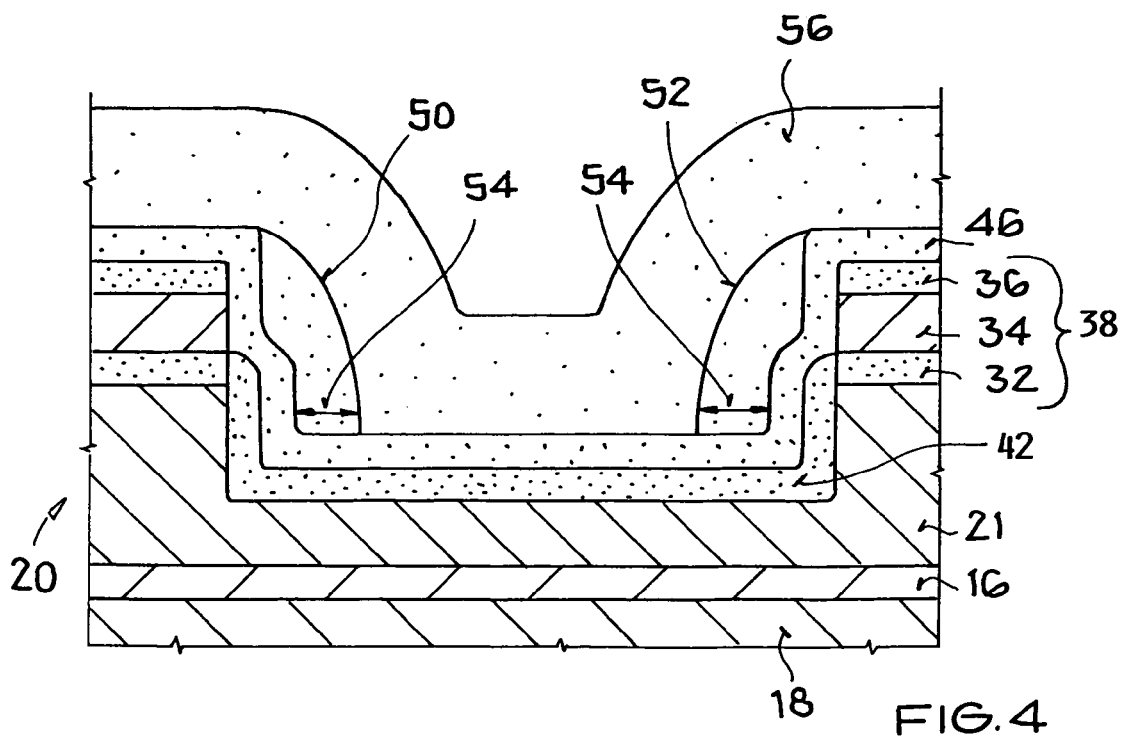
FIG. 4 is a schematic sectional view of the wafer portion according to FIG. 3, after further forming spacers.

Further steps will now be explained with reference to FIG. 4. Next proceeding from the stage of FIG. 3 to the stage of FIG. 4, the polycrystalline semiconductor material 48 in the central area of the trench 40 is anisotropically etched away, whereby the etching preferentially proceeds in the vertical direction toward the floor of the trench 40. Due to the anisotropic nature of the etching, portions of the polycrystalline semiconductor material 48 will only remain along the inner wall surfaces of the trench 40, whereby these remaining portions of the polycrystalline material 48 form spacers 50 and 52. The width 54 of these spacers 50 and 52 defines the resulting width of the seed openings that will be subsequently formed (see FIG. 7) for a later selective epitaxy step. In this manner, seed openings of nearly any desired or arbitrary small dimension can be produced even with technologies having a relatively low structural resolution.

Next, the trench structure 40 with spacers 50 and 52 resulting from the above steps is filled, especially between the two spacers 50 and 52, with a second oxide layer 56, which is preferably formed as a TEOS oxide and may have a thickness of 400 nm, for example. More generally, any oxide can be deposited on the surface of the wafer in order to fill the trench structure. This results in the stage shown in FIG. 4.

Figure 5:
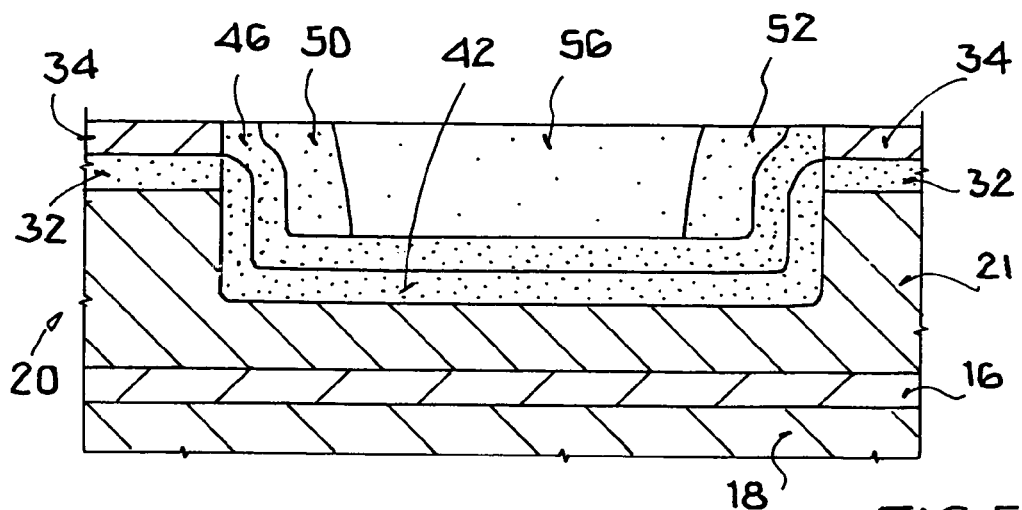
FIG. 5 is a schematic sectional view of the wafer portion of FIG. 4, after further carrying out a planarizing step.

Further steps will now be explained with reference to FIG. 5. Following the stage of FIG. 4, suitable steps are optionally carried out to polish and/or etch-back and remove portions of the TEOS oxide of the second oxide layer 56, and portions of the ONO protective layer 38 lying below the TEOS oxide layer 56, outside of the trench 40, and the resulting surface is planarized through a chemical-mechanical polishing (CMP) step. The TEOS oxide can be, but does not have to be, removed from areas outside of the trench 40 before carrying out the CMP step, by a so-called reverse etch. Preferably, the step of planarizing the resulting structure is carried out so that the nitride layer 34 forming the center layer of the ONO protective layer 38 acts as a polishing stop, i.e. the planarizing polishing is continued to proceed down to the nitride layer 34. Thus, the thickness of the protective layer 38 is reduced through removal of material until the nitride layer 34 is exposed. At this point, the polishing is stopped. The resulting state of the planarized top surface is shown in FIG. 5.

Figure 6:
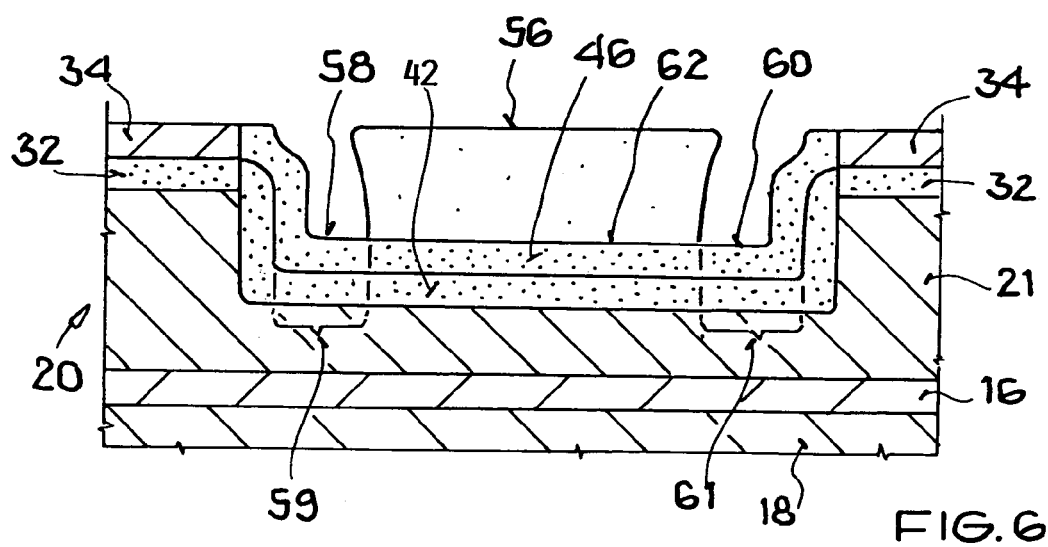
FIG. 6 is a schematic sectional view of the wafer portion of FIG. 5, after further removing the spacers.

Next, the spacers 50 and 52 are removed by an isotropic etching step. Then, the areas or regions 58 and 60 of the thin layer 46 that had been lying under the spacers 50 and 52, i.e. between the respective spacers 50 and 52 and the first oxide layer 42, are removed from the floor and the sides of the trench 40 by an anisotropic etching step. Note that FIG. 6 shows the state of the wafer 20 after the spacers 50 and 52 have been etched away, but before the regions 58 and 60 have been etched away. Then, once the portions 58 and 60 of the thin etch stop layer 46 have been removed, i.e. etched away, only a central portion 62 of the thin layer 46 will remain below the remaining central pillar of the second oxide layer 56.

Figure 7:
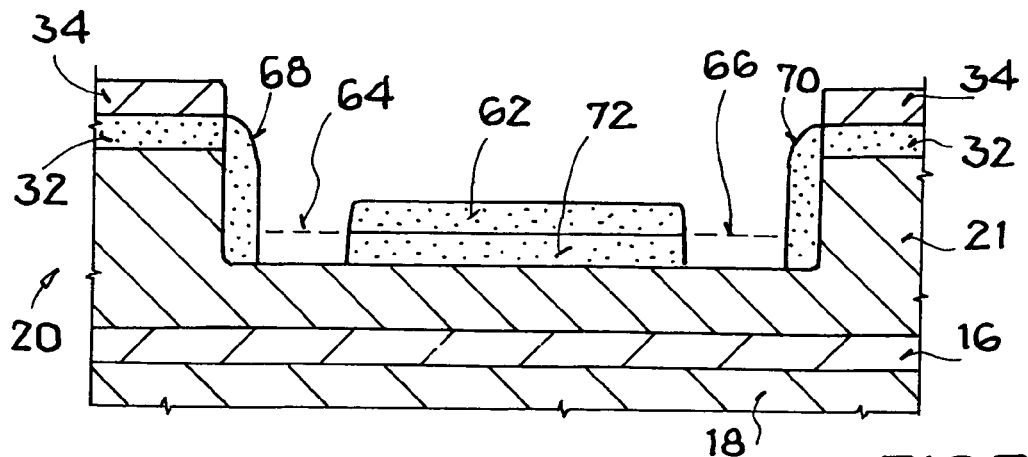
FIG. 7 is a schematic sectional view of the wafer portion of FIG. 6, after further forming seed openings.

Still further steps of the process will now be explained initially with reference to FIG. 7. First, to progress from FIG. 6 to FIG. 7, the remaining portion of the second oxide layer 56 is removed by an anisotropic etching step. Furthermore, since the previous removal of the regions 58 and 60 of the thin etch stop layer 46 has exposed portions or areas 59 and 61 of the first oxide layer 42 that had been below the spacers 50 and 52, the anisotropic etching that removed the remainder of the second oxide layer 56 also removes these portions 59 and 61 of the first oxide layer 42. These portions or areas 59 and 61 are shown still remaining in FIG. 6, and have already been removed in the illustration of FIG. 7. During this etching step, the remaining portion 62 of the thin etch stop layer 46 under the remaining portion of the second oxide layer 56 in the condition of FIG. 6 acts as an etch stop that stops the etching. Remaining under the etch stop layer portion 62 are an underlying portion 72 of the first oxide layer 42 and the underlying layer 21 of active semiconductor material, as shown in FIG. 7.

The etching removal of the portions 59 and 61 of the first oxide layer 42 has formed seed openings 64 and 66 in which a surface of the monocrystalline active semiconductor material of the underlying layer 21 is exposed. Meanwhile, portions 68 and 70 of the first oxide layer 42, which cover the sidewall areas of the trench 40, remain in place, due to the anisotropy of the etching step that formed the seed openings 64 and 66.

Thereafter, a further anisotropic etching step is carried out to remove the rest or remaining portion 62 of the etch stop layer 46, whereby the portion 72 of the first oxide layer 42, which covers the floor of the trench 40 between the seed openings 64 and 66, is exposed. This begins the transition of the process from the stage of FIG. 7 to the stage of FIG. 8.

Figure 8:
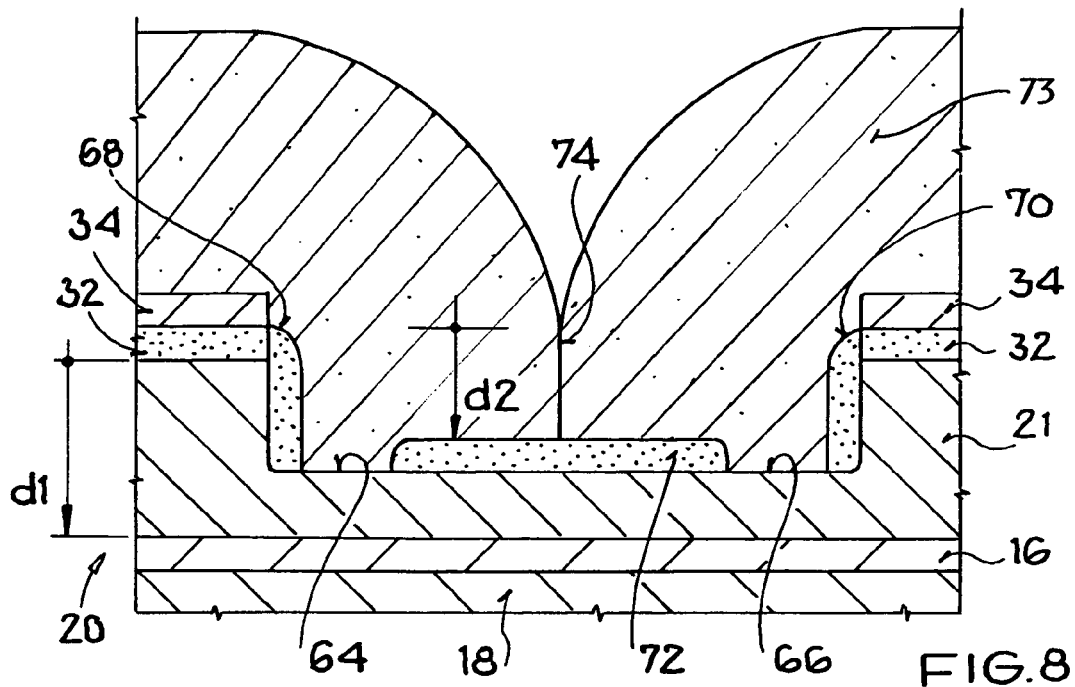
FIG. 8 is a schematic sectional view of the wafer portion of FIG. 7, after further carrying out etching steps and an epitaxial growth step.

Next, with reference to FIG. 8, an epitaxial growth step is carried out, whereby the trench 40 is filled with active semiconductor materials or material regions 73 by the selective epitaxial growth thereof beginning from the seed openings 64 and 66 respectively. This serves to form the active semiconductor material for the second active regions 14 in the structure finally shown in FIG. 2.

As shown in FIG. 8, it is apparent that the above described sequence of process steps has already produced respective regions of active semiconductor material in the wafer 20 respectively having different thicknesses d1 and d2, which are (and/or will be) insulated vertically and laterally from one another and from other layers in a dielectric manner. For example, the remaining portion 72 of the first oxide layer 42 forms an insulating layer to achieve a vertical dielectric insulation, and the remaining portions 68 and 70 of the first oxide layer 42 provide a lateral insulation. Note that the particular desired thickness d2 can be achieved by removing the excess epitaxially grown material as necessary. In this regard, it is simply necessary that the epitaxial growth was continued long enough so that epitaxial material 73 has grown out past or deeper than the required final depth d2. Also note that the two epitaxial regions have grown together along a growth joint 74, which will preferably later be removed along with the removal of other excess epitaxial material 73.

Material may be removed, for example, through a further chemical-mechanical polishing step, whereby the remainder or rests of the nitride layer 34 of the ONO protective layer 38 serve as a polishing stop. In this regard, the planarization and reduction of the thickness of the resulting structure is carried out so far that remaining active semiconductor material does not protrude beyond or higher than the walls of the trench. Furthermore, the active semiconductor material 73 is preferably removed directly along the growth joint 74 resulting from the selective epitaxy, in order to avoid leakage currents that might otherwise be caused thereby in the later operation of the device. This removal of the excess semiconductor material 73 effects the transition from FIG. 8 to FIG. 9, whereby the portions of the material 73 left remaining will form the second active regions 14.

Figure 9:
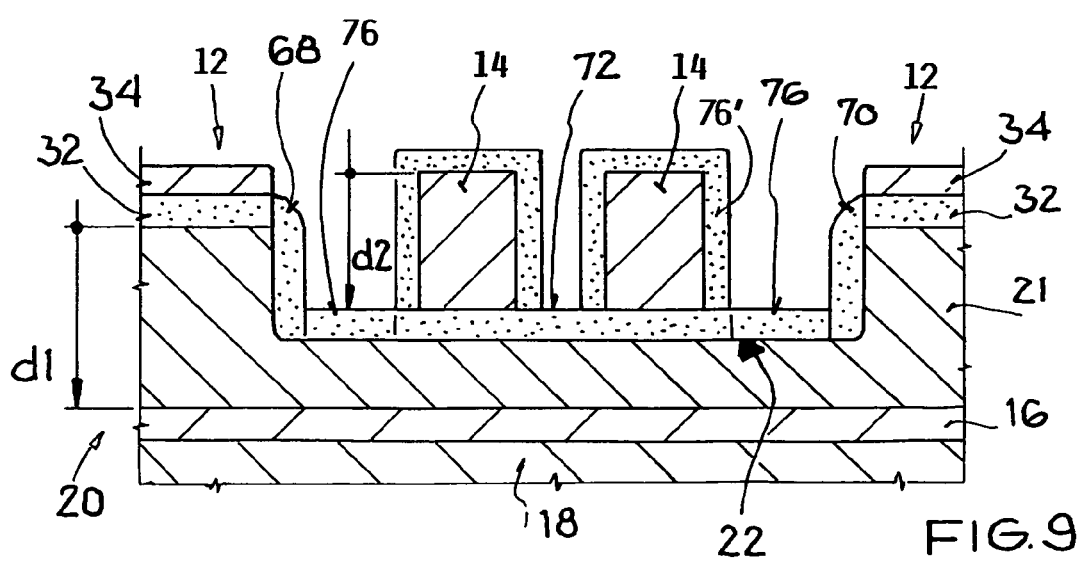
FIG. 9 is a schematic sectional view of the wafer portion of FIG. 8, after further carrying out lithographic and etching steps to define active regions thereof, and providing additional insulating material.

Simultaneously, the seed openings 64 and 66 for the selective epitaxy are again opened or exposed by removing the epitaxial material 73 from the openings 64 and 66, and thereafter are closed once again with a new oxide 76 that additionally forms an insulating intermediate layer 76' that surrounds and insulates the second active regions 14 of the active semiconductor material. This state is illustrated in FIG. 9. The oxide material 76 and the oxide layer 76' complete the vertical and lateral electrical insulation of the second active regions 14 from the first active regions 12. Additionally, the remaining volume of the trench may be filled with an oxide, to complete the insulating separator structure 22 in which the second active regions 14 are embedded, for example as shown in FIG. 2.

Thus, the above described sequence of process steps produces second semiconductor regions 14 in the SOI wafer 20, which are laterally and vertically completely dielectrically insulated from the first semiconductor material active regions 12, and from other underlying layers (e.g. the underlying semiconductor material layer 21). In the resulting structure, the dielectric separation and isolation are achieved by the dielectric separator structure 22 that is formed by the above mentioned insulating regions or portions 68, 70, 72, 76 and 76'.

From the processed wafer 20 shown in FIG. 9, various additional known semiconductor device processing steps can be carried out to produce the further fabricated wafer 20 as shown in FIG. 2 and discussed above. Note, for example, that a further polishing step can be applied to again open or expose the top surfaces of the respective active regions 12 and 14 by removing the respective top layer(s) of insulating material.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of producing active semiconductor regions in an SOI wafer, comprising the steps:
   a) providing an SOI wafer including an active layer of active semiconductor material on an insulating layer;
   b) covering at least a selected area of said active layer with a protective layer;
   c) in said selected area, forming a trench to penetrate through said protective layer and into said active layer, while leaving first active semiconductor regions of said active semiconductor material of said active layer remaining beside said trench;
   d) covering at least a partial surface area of said trench with a first oxide layer;
   e) after said step d), forming spacers within said trench directly or indirectly on said first oxide layer at sides of said trench;
   f) filling said trench between said spacers with a second oxide layer;
   g) forming seed openings through portions of said first oxide layer lying under said spacers by removing said spacers and removing said portions of said first oxide layer to form said seed openings extending to said active semiconductor material of said active layer;
   h) epitaxially growing epitaxial semiconductor material regions within said trench beginning and progressing from said seed openings to areas displaced from said seed openings;
   i) again opening said seed openings by removing portions of said epitaxial semiconductor material regions in and leading to said seed openings;
   j) leaving portions of said epitaxial semiconductor material regions remaining, to form thereof second active semiconductor regions within said trench; and
   k) after said step i), providing an insulating intermediate material to close and insulate said seed openings;
   wherein said first active semiconductor regions have a first thickness in a direction perpendicular to a plane of said insulating layer, said second active semiconductor regions have a second thickness in said direction that is smaller than said first thickness, and said second active semiconductor regions are completely laterally and vertically dielectrically insulated from said first active semiconductor regions.

2. The method according to claim 1, further comprising additionally providing said insulating intermediate material on sides of said second active semiconductor regions, wherein said insulating intermediate material as well as remaining portions of said first oxide layer under said second active semiconductor regions serve to completely laterally and vertically dielectrically insulate said second active semiconductor regions from said first active semiconductor regions.

3. The method according to claim 2, further comprising additionally providing said insulating intermediate material to fill a remaining open space of said trench after said step j).

4. The method according to claim 1, further comprising, between said steps f) and g), an additional step of removing some of said second oxide layer that protrudes out of said trench so as to reduce a thickness of said second oxide layer to a remaining thickness not greater than a depth of said trench.

5. The method according to claim 4, further comprising, between said steps d) and e), an additional step of providing an etch stop layer covering said first oxide layer, and wherein said step of removing some of said second oxide layer is carried out at least until reaching said etch stop layer so that said etch stop layer serves as an etch stop.

6. The method according to claim 1, further comprising, between said steps d) and e), an additional step of providing an etch stop layer covering said first oxide layer.

7. The method according to claim 6, wherein said removing of said spacers in said step g) is carried out by anisotropic etching wherein said etch stop layer serves as an etch stop to stop said anisotropic etching.

8. The method according to claim 7, wherein said step g) further comprises additional etching to remove exposed portions of said etch stop layer and to form said seed openings also through said etch stop layer in addition to through said portions of said first oxide layer.

9. The method according to claim 1, further comprising, before said step h), removing all remainder of said second oxide layer.

10. The method according to claim 1, wherein said forming of said trench is carried out by performing an STI-etching process.

11. The method according to claim 1, wherein said forming of said spacers in said step e) comprises the sub-steps:
    covering at least inner wall surface areas of said trench at said sides of said trench, directly or indirectly on said first oxide layer, with a polycrystalline semiconductor material; and
    anisotropically etching away any of said polycrystalline semiconductor material directly or indirectly on said first oxide layer at a central area on a floor of said trench, to leave remaining only portions of said polycrystalline semiconductor material that form said spacers directly or indirectly on said first oxide layer at said sides of said trench.

12. The method according to claim 1, wherein said filling of said trench between said spacers in said step f) comprises depositing a TEOS-oxide to form said second oxide layer.

13. The method according to claim 1, wherein said covering at least said selected area of said active layer in said step b) comprises covering at least said selected area with a first oxide partial layer, covering said first oxide partial layer with a nitride layer, and covering said nitride layer with a second oxide partial layer, so that said first oxide partial layer, said nitride layer and said second oxide partial layer together form said protective layer.

14. The method according to claim 13, further comprising a planarizing removal of material from at least an outer surface of said protective layer so as to reduce a thickness of said protective layer until said nitride layer is exposed.

15. The method according to claim 14, wherein said planarizing removal of material further removes a portion of said second oxide layer and said spacers to a plane of said nitride layer between said steps f) and g).

16. The method according to claim 14, further comprising a planarization polishing after said step h) to remove a portion of said epitaxial semiconductor material regions to a plane of said nitride layer so that said nitride layer serves as a polishing stop to stop said planarization polishing and so that said second active semiconductor material regions do not protrude out of said trench beyond said plane.

17. The method according to claim 1, further comprising, after said step h), a planarizing process to remove a portion of said epitaxial semiconductor regions protruding out of said trench beyond a planarization plane, so that thereafter said second active semiconductor material regions do not protrude out of said trench beyond said planarization plane.

18. The method according to claim 1, wherein said epitaxial semiconductor material regions grow to contact one another along a growth joint in said step h), and further comprising removing some of said epitaxial semiconductor material regions along said growth joint after said step h).

19. The method according to claim 18, wherein said removing of some of said epitaxial semiconductor material regions is carried out in parallel with said step i).

20. The method according to claim 1, wherein said step j) includes removing all of said epitaxial semiconductor material regions other than said second active semiconductor material regions.

21. The method according to claim 1, wherein said active semiconductor material and said epitaxial semiconductor material regions respectively comprise silicon.

* * * * *